(12) United States Patent
Yumura et al.

(10) Patent No.: US 10,797,677 B2
(45) Date of Patent: Oct. 6, 2020

(54) CRYSTAL VIBRATION ELEMENT AND CRYSTAL DEVICE

(71) Applicant: KYOCERA Corporation, Kyoto-shi, Kyoto (JP)

(72) Inventors: Masatoshi Yumura, Yamagata (JP); Takanori Maeno, Higashine (JP)

(73) Assignee: KYOCERA Corporation, Kyoto-Shi, Kyoto (JP)

( * ) Notice: Subject to any disclaimer, the term of this patent is extended or adjusted under 35 U.S.C. 154(b) by 0 days.

(21) Appl. No.: 16/263,070

(22) Filed: Jan. 31, 2019

(65) Prior Publication Data

US 2019/0267964 A1  Aug. 29, 2019

(30) Foreign Application Priority Data

Feb. 28, 2018 (JP) .................. 2018-034426

(51) Int. Cl.
| | |
|---|---|
| *H03H 9/19* | (2006.01) |
| *H03H 9/02* | (2006.01) |
| *H03H 9/13* | (2006.01) |
| *H03B 5/32* | (2006.01) |
| *H03H 9/17* | (2006.01) |
| *H01L 41/09* | (2006.01) |
| *H03H 9/05* | (2006.01) |

(52) U.S. Cl.
CPC .......... *H03H 9/02157* (2013.01); *H01L 41/09* (2013.01); *H03B 5/32* (2013.01); *H03H 9/0595* (2013.01); *H03H 9/13* (2013.01); *H03H 9/177* (2013.01); *H03H 9/19* (2013.01); *H03B 2200/0014* (2013.01)

(58) Field of Classification Search
CPC ...... H01L 41/09; H03H 9/0595; H03H 9/177; H03H 9/13; H03H 9/02
See application file for complete search history.

(56) References Cited

U.S. PATENT DOCUMENTS

| | | | | |
|---|---|---|---|---|
| 9,431,995 | B2 * | 8/2016 | Yamashita | ............... H03H 9/19 |
| 9,496,480 | B2 * | 11/2016 | Naito | ............ H01L 41/0825 |
| 9,712,138 | B2 * | 7/2017 | Yamashita | ............. H03H 9/177 |
| 2007/0096596 | A1 * | 5/2007 | Naito | ..................... H03H 9/177 |
| | | | | 310/320 |

(Continued)

FOREIGN PATENT DOCUMENTS

| | | |
|---|---|---|
| JP | 2013-192044 A | 9/2013 |
| JP | 2013-197916 A | 9/2013 |

*Primary Examiner* — J. San Martin
(74) *Attorney, Agent, or Firm* — Volpe and Koenig, P.C.

(57) ABSTRACT

A crystal blank includes a pair of tableland-shaped first mesa parts projecting from a flat plate and a pair of tableland-shaped second mesa parts projecting from the pair of first mesa parts. The flat plate's length in a long direction is less than 1000 μm. The first mesa part is on an inner side of the flat plate's major surface. The second mesa part is on the first mesa part's inner side of an upper surface's outer edge at two ends of the long direction and has a width equivalent to the first mesa part's upper surface at two sides of a short direction. An excitation electrode reaches the second mesa part's outer edge of the upper surface, is located on the inner side of the first mesa part, and on the second mesa part's inner side of the upper surface's outer edge at two sides of the short direction.

7 Claims, 9 Drawing Sheets

(56) References Cited

U.S. PATENT DOCUMENTS

| | | | |
|---|---|---|---|
| 2011/0203083 A1* | 8/2011 | Sasaki | H03H 3/02 29/25.35 |
| 2012/0126668 A1* | 5/2012 | Ii | H03H 3/02 310/357 |
| 2012/0235762 A1* | 9/2012 | Ii | H03H 9/177 331/158 |
| 2013/0241359 A1* | 9/2013 | Naito | H01L 41/053 310/348 |
| 2013/0249353 A1 | 9/2013 | Naito et al. | |

* cited by examiner

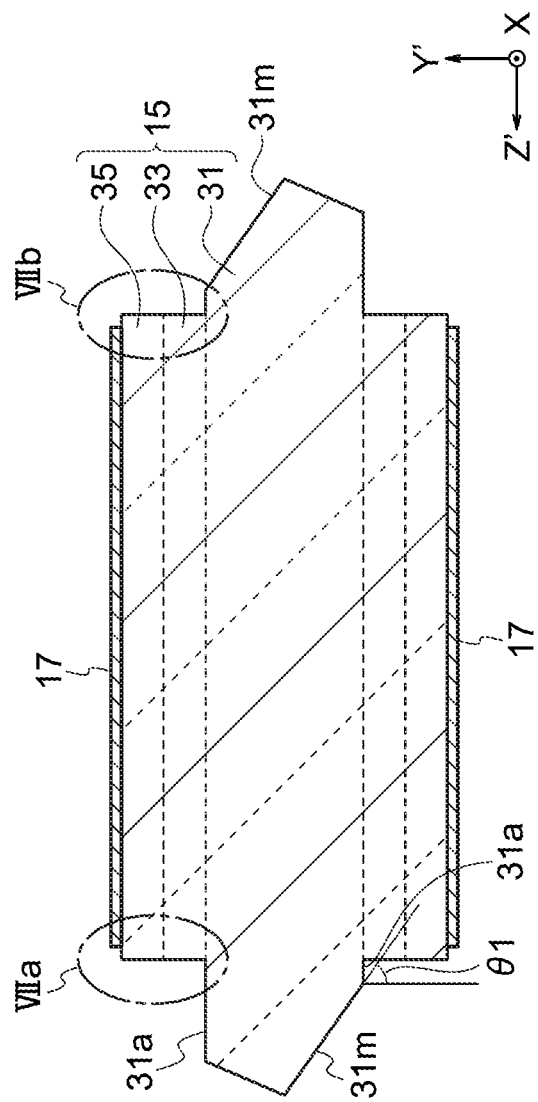
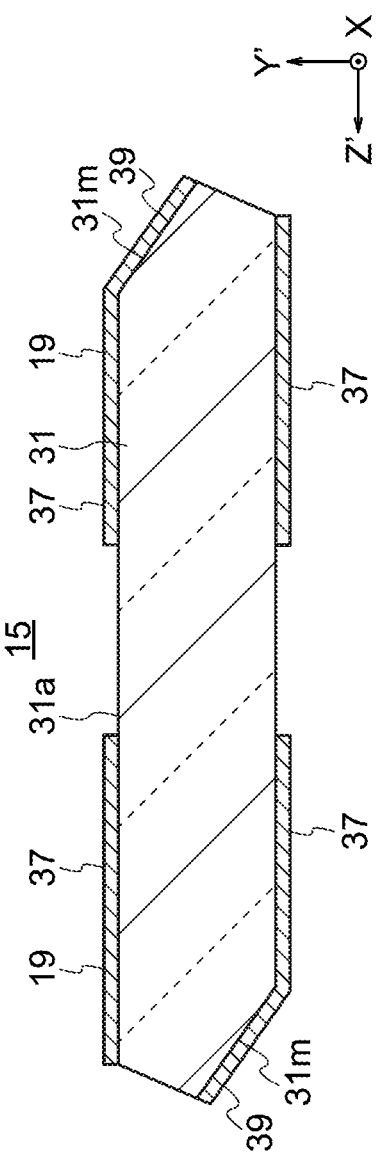

CRYSTAL VIBRATION ELEMENT AND CRYSTAL DEVICE

TECHNICAL FIELD

The present disclosure relates to a crystal vibration element and a crystal device. The crystal device is for example a crystal unit or crystal oscillator.

BACKGROUND ART

A crystal vibration element has for example a plate-shaped crystal blank and a pair of excitation electrodes superposed on a pair of major surfaces (broadest surfaces, front and back of a plate-shaped member) of the crystal blank. As the plate-shaped crystal blank, a so-called mesa-type one is known (for example Patent Literature 1 or 2). Further, Patent Literature 1 and 2 disclose crystal blanks having two-step mesa parts. That is, the crystal blank in each of these citations has a flat plate part, a pair of tableland-shaped first mesa parts projecting from the two major surfaces of the flat plate part, and a pair of tableland-shaped second mesa parts projecting from the upper surfaces of the pair of first mesa parts. Patent Literature 1 discloses a variety of excitation electrodes having various sizes relative to the size of the two-step mesa part. Patent Literature 2 discloses a crystal blank in which the width of the first mesa part and the width of the second mesa part are equivalent.

CITATION LIST

Patent Literature

Patent Literature 1: Japanese Patent Publication No. 2013-192044
Patent Literature 2: Japanese Patent Publication No. 2013-197916

SUMMARY OF INVENTION

Solution to Problem

A crystal vibration element according to one aspect of the present disclosure includes a crystal blank and a pair of excitation electrodes. The crystal blank is plate shaped cut for thickness shear vibration in which a long direction is a vibration direction. The pair of excitation electrodes are located on two surfaces of the crystal blank. The crystal blank includes a flat plate part, first mesa parts, and second mesa parts. The flat plate part has a pair of major surfaces. The first mesa parts are tableland-shaped projecting from the pair of major surfaces. The second mesa parts are tableland-shaped projecting from upper surfaces of the pair of first mesa parts. In the flat plate part, a length in the long direction is longer than a length in a short direction perpendicular to the long direction in a plan view, and the length in the long direction is less than 1000 μm. In the first mesa part, a length in the long direction is longer than a length in the short direction. The first mesa part is located on an inner side from an outer edge of the major surface of the flat plate part over the entire circumference of the outer edge. In the second mesa part, a length in the long direction is longer than a length in the short direction. The second mesa part is located on an inner side from an outer edge of the upper surface of the first mesa part at two sides of the long direction. The second mesa part has an equivalent width to the upper surface of the first mesa part in the short direction. The excitation electrode, at the two sides of the long direction, reaches an outer edge of an upper surface of the second mesa part and is located on an inner side from the outer edge of the upper surface of the first mesa part. The excitation electrode is located on an inner side from the outer edge of the upper surface of the second mesa part at two sides of the short direction.

BRIEF DESCRIPTION OF DRAWINGS

FIG. 5A is a cross-sectional view taken along the Va-Va line in FIG. 3, and FIG. 5B is a cross-sectional view taken along the Vb-Vb line in FIG. 3.

DESCRIPTION OF EMBODIMENT

Figure 1:
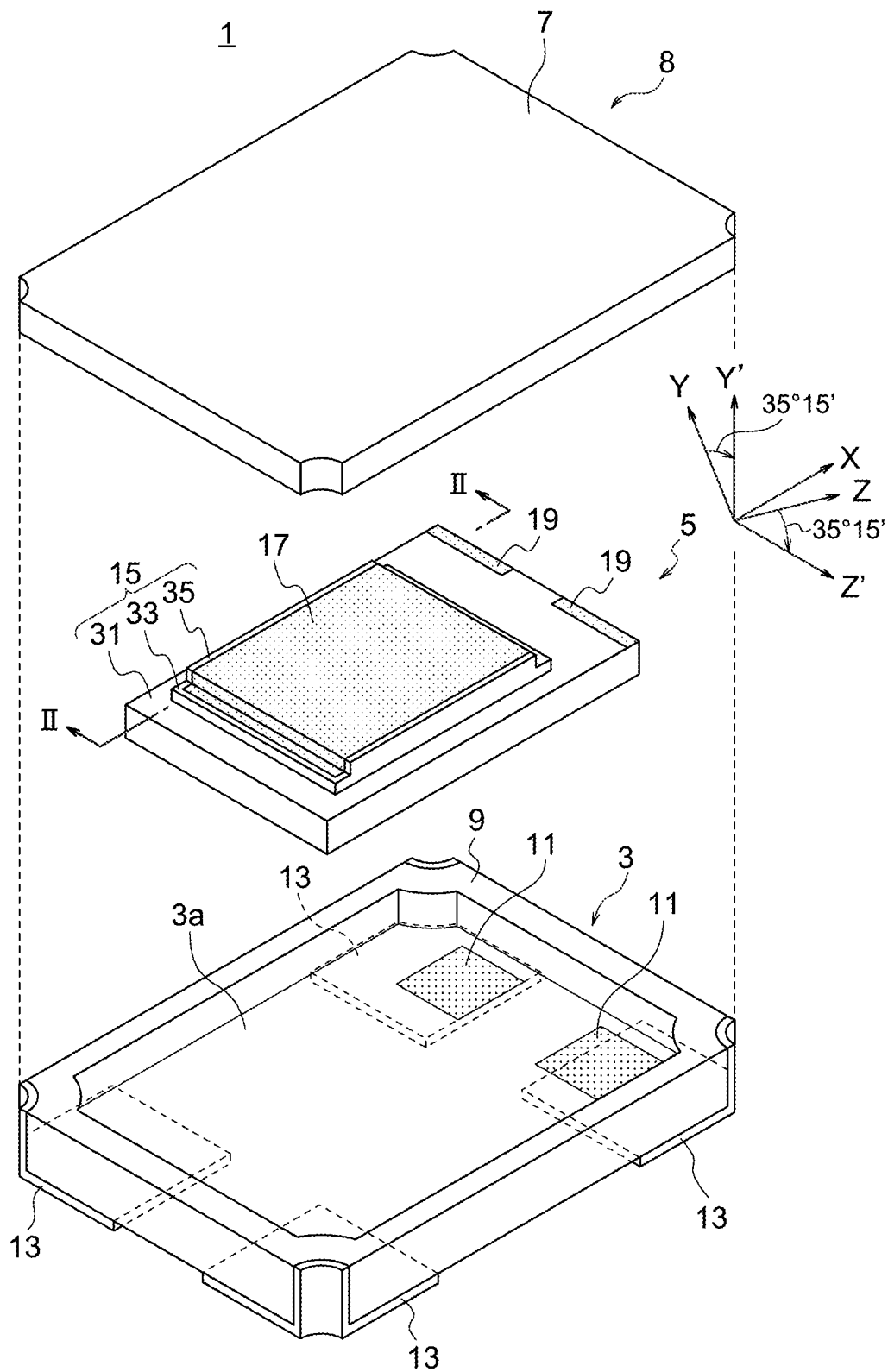
FIG. 1 is a disassembled perspective view showing a schematic configuration of a crystal unit according to an embodiment.

Below, an embodiment of the present disclosure will be explained with reference to the drawings. Note that, the drawings used in the following explanation are schematic ones. Size ratios etc. in the drawings do not always coincide with the actual ones. For convenience, sometimes hatching will be attached to the surfaces of the layered members (that is the surfaces which are not cross-sections).

Figure 2:
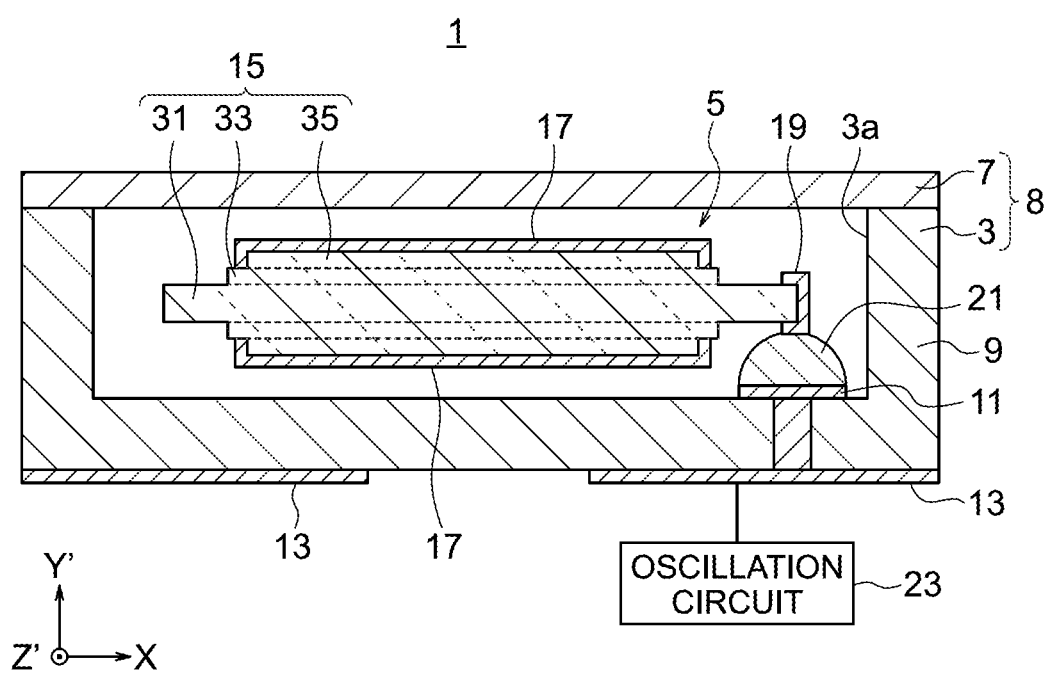
FIG. 2 is a cross-sectional view taken along the II-II line in FIG. 1 which shows the configuration of the crystal unit in FIG. 1.

Regarding the crystal vibration element and crystal device in the present disclosure, any directions may be defined as the "upper side" or "lower side". However, for convenience, sometimes use will be made of the "upper surface" or "lower surface" or other terms where the upper part on the drawing sheet (+Y' side) in FIG. 1 and FIG. 2 is the upper side. For the tableland-shaped mesa parts, irrespective of the upper or lower side, the surface facing the projecting direction will be defined as the upper surface. When simply referring to "when viewed on a plane" or "plane perspective view", it means "viewed in the Y' axis direction" unless particularly explained otherwise.

(Overall Configuration of Crystal Unit)

FIG. 1 is a disassembled perspective view showing a schematic configuration of a crystal unit 1 (below, sometimes "crystal" will be omitted) according to an embodiment of the present disclosure. Further, FIG. 2 is a cross-sectional view taken along the II-II line in FIG. 1 which shows the configuration of the unit 1.

The unit 1 is for example a substantially thin rectangular cuboid-shaped electronic part as a whole. The dimensions thereof may be suitably set. For example, in relatively small one, the length of the long side (X-axis direction) or short side (Z' axis direction) is 0.6 mm to 2 mm, and the thickness (Y' axis direction) is 0.2 mm to 0.8 mm.

The unit 1 has for example an element mounting member 3 in which a recessed part 3a is formed, a crystal vibration element 5 (below, sometimes "crystal" will be omitted) held in the recessed part 3a, and a lid 7 closing the recessed part 3a.

The vibration element 5 is the part generating vibration utilized for generation of oscillation signals. The element mounting member 3 and lid 7 configure a package 8 packaging the vibration element 5. The recessed part 3a in the element mounting member 3 is sealed by the lid 7. Its internal portion is for example evacuated or sealed with a suitable gas (for example nitrogen).

The element mounting member 3 has for example a base body 9 which becomes the principal part of the element mounting member 3, a pair of element mounting pads 11 for mounting the vibration element 5, and a plurality of (four in the example shown) external terminals 13 for mounting the unit 1 on a not shown circuit board or the like.

The base body 9 is configured by ceramic or another insulation material and configures the recessed part 3a described above. The element mounting pads 11 are configured by conductive layers made of metal or the like and are positioned on the bottom surface of the recessed part 3a. The external terminals 13 are configured by conductive layers made of metal or the like and are positioned on the lower surface of the base body 9. The element mounting pads 11 and the external terminals 13 are connected to each other by conductors (FIG. 2, notations are omitted) arranged in the base body 9. The lid 7 is configured by for example metal and is bonded to the upper surface of the element mounting member 3 by seam welding or the like.

The vibration element 5 has for example a crystal blank 15, a pair of excitation electrodes 17 for supplying voltage to the crystal blank 15, and a pair of lead electrodes 19 for mounting the vibration element 5 on the pair of element mounting pads 11. The vibration element 5 is given for example a rotationally symmetrical configuration around a symmetrical axis parallel to the X-axis. Accordingly, in the following explanation, sometimes the vibration element 5 will be explained without differentiating the front and back of the vibration element 5.

The vibration element 5 is substantially plate-shaped and is held in the recessed part 3a so as to face the bottom surface of the recessed part 3a. Further, the pair of lead electrodes 19 are bonded to the pair of element mounting pads 11 by a pair of bumps 21 (FIG. 2). Due to this, the vibration element 5 is supported upon the element mounting member 3 in a cantilever manner. Further, the pair of excitation electrodes 17 are electrically connected through the pair of lead electrodes 19 to the pair of element mounting pads 11 and consequently electrically connected to any two among the plurality of external terminals 13. The bumps 21 are made of for example conductive adhesive. The conductive adhesive is for example configured by mixing a conductive filler into a thermosetting resin.

The unit 1 configured in this way is for example arranged on a mounting surface of a not shown circuit board with the lower surface of the element mounting member 3 facing it and is mounted on the circuit board by bonding the external terminals 13 to the pads on the circuit board by solder or the like. On the circuit board, for example, an oscillation circuit 23 (FIG. 2) is configured. The oscillation circuit 23 supplies an AC voltage through the external terminals 13 and element mounting pads 11 to the pair of excitation electrodes 17 and generates oscillation signals. At this time, the oscillation circuit 23 utilizes for example fundamental-wave oscillation of the crystal blank 15. Overtone vibration may be utilized as well.

(Configuration of Crystal Blank)

The crystal blank 15 is for example a so-called AT-cut plate. That is, as shown in FIG. 1, in a quartz crystal, when an orthogonal coordinate system XYZ comprised of an X-axis (electrical axis), Y-axis (mechanical axis), and Z-axis (optical axis) is rotated around the X-axis by 30° to 40° (35° 15' as one example) and defining an orthogonal coordinate system XY' Z', the crystal blank 15 is plate-shaped cut parallel to the XZ' plane.

In other words, the crystal blank 15 is cut so that a thickness shear vibration is generated when an AC voltage is supplied to the two major surfaces. The thickness shear vibration is a vibration where the two major surfaces move relative to each other in a direction parallel to the major surfaces. The X-axis direction is the vibration direction in the AT-cut plate.

Figure 3:
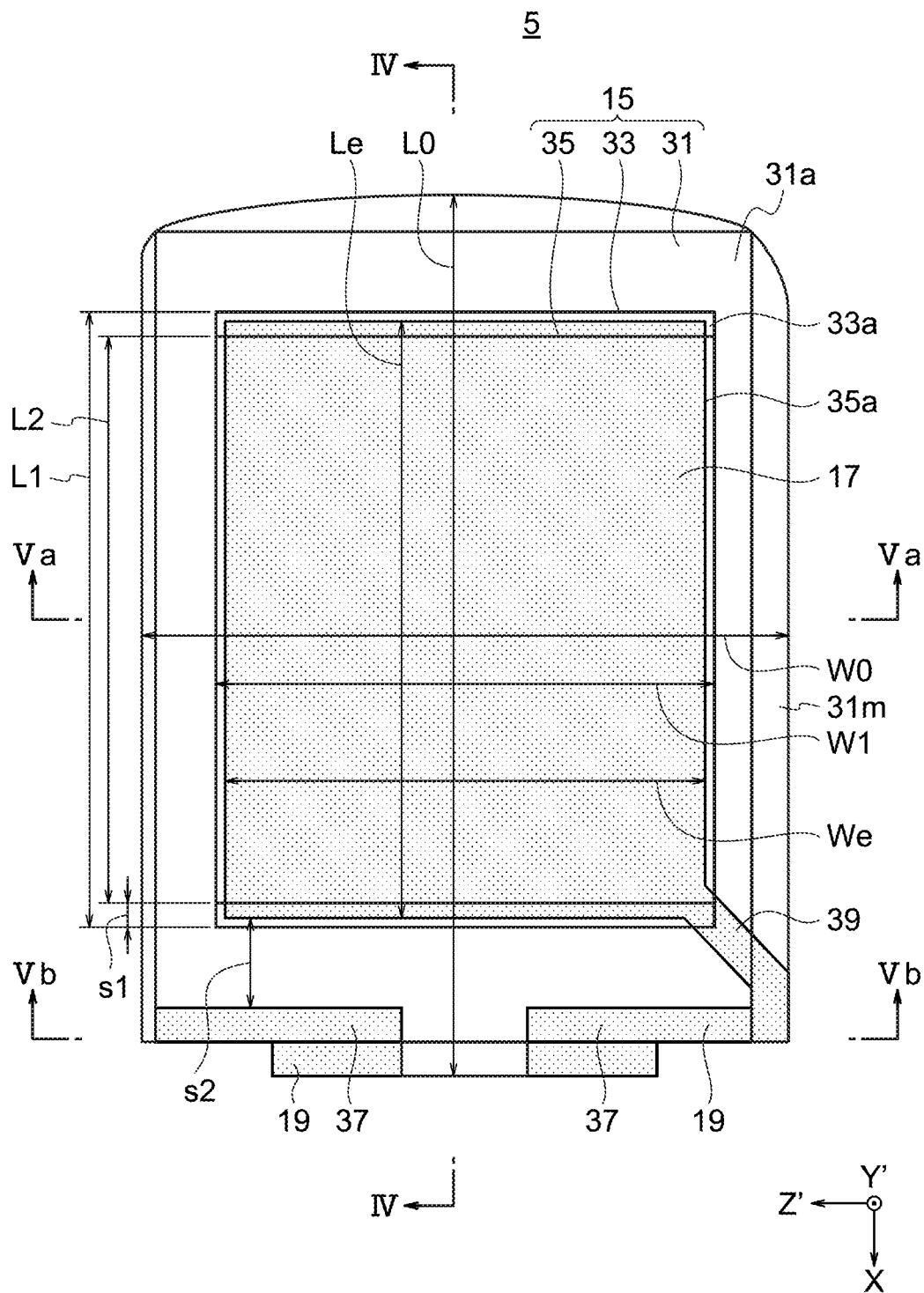
FIG. 3 is a plan view showing a crystal vibration element included in the crystal unit in FIG. 1.
Figure 4:
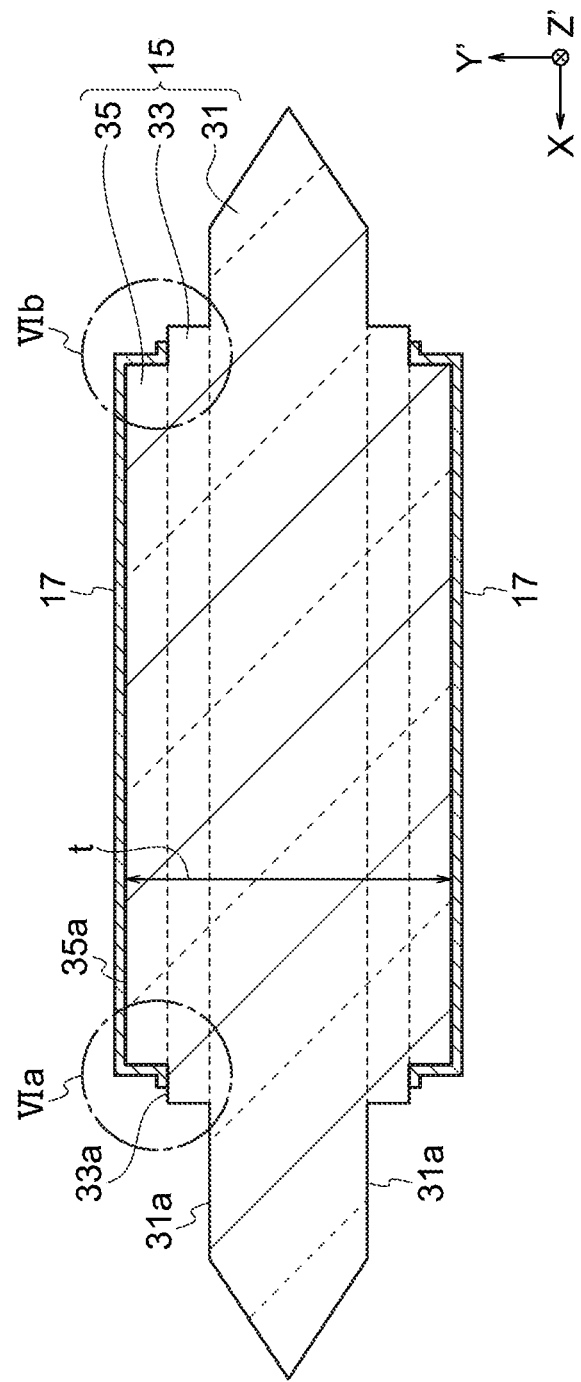
FIG. 4 is a cross-sectional view taken along the IV-IV line in FIG. 3.
Figure 6A:
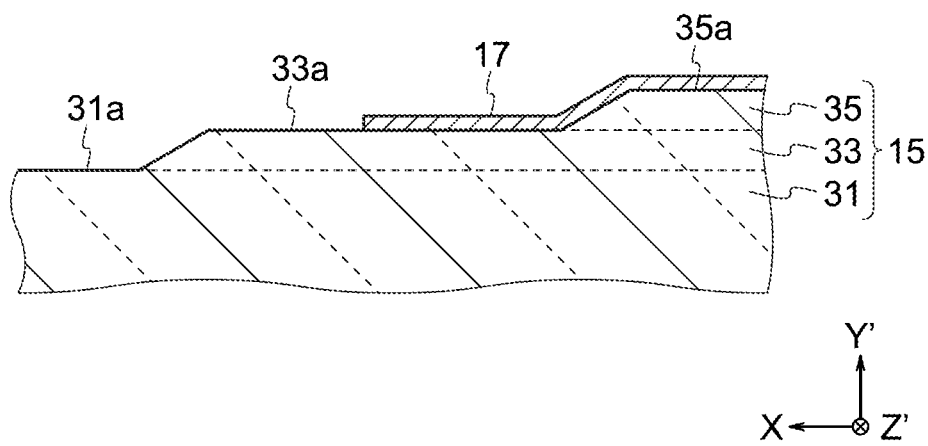
FIG. 6A is an enlarged view of a region VIa in FIG. 4.
Figure 6B:
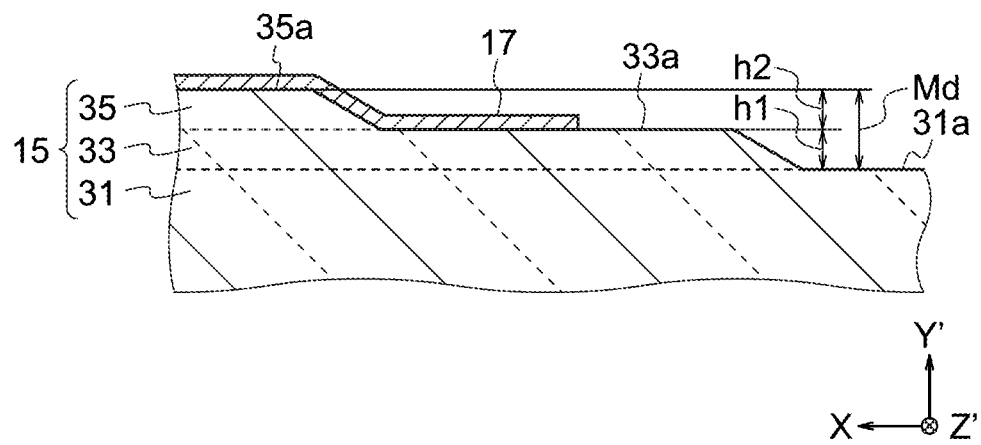
FIG. 6B is an enlarged view of a region VIb in FIG. 4.
Figure 7A:
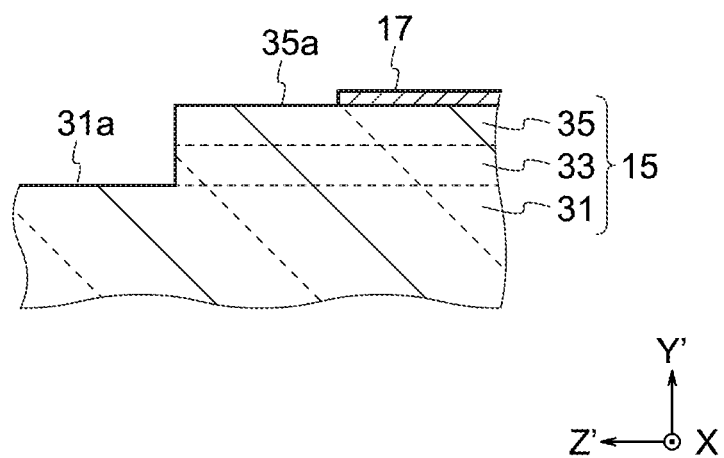
FIG. 7A is an enlarged view of a region VIIa in FIG. 5A.
Figure 7B:
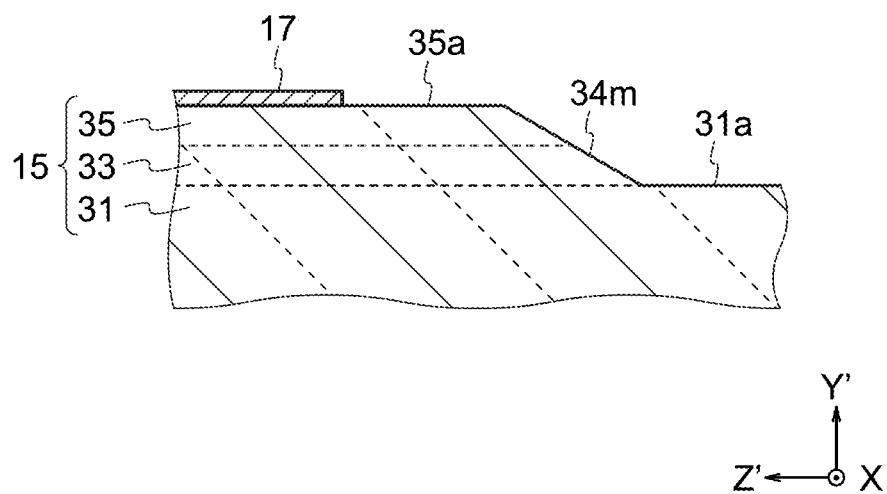
FIG. 7B is an enlarged view of a region VIIb in FIG. 5A.

FIG. 3 is a plan view of the vibration element 5. FIG. 4 is a cross-sectional view taken along the IV-IV line in FIG. 3. FIG. 5A is a cross-sectional view taken along the Va-Va line in FIG. 3. FIG. 5B is a cross-sectional view taken along the Vb-Vb line in FIG. 3. FIG. 6A is an enlarged view of a region VIa in FIG. 4. FIG. 6B is an enlarged view of a region VIb in FIG. 4. FIG. 7A is an enlarged view of a region VIIa in FIG. 5A. FIG. 7B is an enlarged view of a region VIIb in FIG. 5A.

Among these views, the plan view (FIG. 3) and enlarged views (FIG. 6A, FIG. 6B, FIG. 7A, and FIG. 7B) show the crystal blank 15 with mutual dimensional ratios relatively close to the mutual dimensional ratios in the crystal blank 15 according to the embodiment. On the other hand, in the perspective view (FIG. 1) and cross-sectional views (FIG. 2, FIG. 4, FIG. 5A, and FIG. 5B) showing the entirety of the vibration element 5, for convenience of illustration, the enlargement of the thickness (dimension in the Y' axis direction) is made larger than the enlargement in the surface direction (dimension of the XZ' plane). Further, in these perspective view and cross-sectional views, details are emphasized or omitted. For example, the steps in the mesa part which will be explained later are shown larger than actual ones, and residue in the steps (etching error) is omitted.

The crystal blank 15 has a flat plate part 31 having a pair of major surfaces 31a, a pair of tableland-shaped first mesa parts 33 projecting from the pair of major surfaces 31a, and a pair of tableland-shaped second mesa parts 35 projecting from upper surfaces 33a of the pair of first mesa parts 33. They are formed integrally by the same material in their entireties.

Note that, in the cross-sectional views (FIG. 2, FIG. 4, FIG. 5A, and FIG. 6A to FIG. 7B), for convenience, borders of the flat plate part 31, first mesa parts 33, and second mesa parts 35 are shown. These borders are just conceptual ones based on the positions of the surfaces (surfaces exposed to the outside) of the flat plate 31, first mesa parts 33, and second mesa parts 35.

Although notations are not particularly attached, from another viewpoint, the crystal blank 15 has a center part in which the three types of parts of the flat plate part 31, first mesa parts 33, and second mesa parts 35 are superposed, intermediate parts in which only the flat plate part 31 and first mesa parts 33 are superposed (peripheral portions of the center part), and outer peripheral parts configured by only the flat plate part 31 (peripheral parts of the intermediate parts). The vibration part (center part or center part and intermediate parts) generates a thickness shear vibration by application of voltage. By the vibration part being formed thicker relative to the outer peripheral parts, an energy trapping effect is improved.

(Flat Plate Part)

The flat plate part 31 is formed in a flat plate shape. Accordingly, the flat plate part 31 has a pair of major surfaces 31a which are substantially plane shaped and substantially parallel to each other. From another viewpoint, the thickness between the major surfaces 31a of the flat plate part 31 is substantially constant.

The planar shape of the flat plate part 31 may be suitably formed. In the example shown, it is substantially rectangular. That is, the flat plate part 31 has a rectangular pair of major surfaces 31a and four side surfaces (notations are omitted) corresponding to its four sides. Note that, in the present disclosure, the "rectangle" (shape having a pair of long sides and a pair of short sides) includes a shape where the corner portions are chamfered unless it particularly explained otherwise.

The flat plate part 31 is formed so that the vibration direction of the thickness share vibration is the long direction. For example, where the crystal blank 15 is an AT-cut plate and the flat plate part 31 is rectangular, the long sides are the sides substantially parallel to the X-axis, and the short sides are the sides substantially parallel to the Z' axis.

As shown in FIG. 4 and FIG. 5A etc., the four side surfaces of the flat plate part 31 do not become for example planes which are parallel to the normal line of the major surfaces 31a (Y' axis). This is because, for example, the crystal blank 15 is formed by etching of a crystal wafer and consequently the four side surfaces are comprised of crystal faces appearing by etching. Inclination angles of these crystal faces are for example defined according to a cut angle (crystal orientation) and defined also according to etching conditions (etching time and the like).

As shown in FIG. 5A, at the side surfaces on the two sides in the Z' axis direction, crystal faces appear rotationally symmetrically, and consequently the side surface on the +Z' side and the side surface on the −Z' side are rotationally symmetrically shaped relative to each other.

Each of the side surfaces in the Z' axis direction has for example an m-face 31m. More specifically, on the +Z' side, an m-face 31m intersecting (connected) with the major surface 31a on the −Y' side is formed. On the −Z' side, an m-face 31m intersecting with the major surface 31a on the +Y' side is formed. An inclination angle θ1 (FIG. 5A) of the m-face 31m relative to the normal line of the major surface 31a (with which this m-face 31m intersects) is for example about 54° (52° to 56°). Note that, the m-face 31m is a face which relatively easy appears without regard as to the etching conditions. The size of the m-face 31m on the Y' Z' cross-section may be suitably set. For example, the m-face 31m has a size of 30% to 70%, 40% to 60%, or half (example shown) of the thickness of the flat plate part 31 in the thickness direction (Y' axis direction) of the flat plate part 31.

At each of the side surfaces in the Z' axis direction, a crystal face configuring a face connecting the major surface 31a and the m-face 31m (notations are omitted, the face on the +Z' side and the +Y' side and the face on the −Z' side and the −Y' side) is different according to the etching conditions (etching time etc.). For example, this face is comprised of a crystal face having an angle of about 3°, a crystal face having an angle of about 18° or a crystal face having an angle of about 37° as an inclination angle relative to the normal line of the major surface 31a, or a combination of these crystal faces. Note that, in any case, in these crystal faces, the inclination angle relative to the normal line of the major surfaces 31a (Y' axis) is small in comparison with the m-face 31m.

Further, for example, as shown in FIG. 4, at the side surfaces in the X-axis direction, crystal faces appear line symmetrically relative to the symmetrical axis parallel to the X-axis (they are line symmetrically shaped). Note that, the crystal face appearing at the side surface on the +X side and the crystal face appearing at the side surface on the −X side are for example different in inclination angle from each other. The side surface on the −X side is comprised of for example a crystal face having an inclination angle of about 55° relative to the normal line of the major surface 31a. The side surface on the +X side is comprised of for example a crystal face having an angle of about 27° or a crystal face having an angle of about 58° as an inclination angle relative to the normal line of the major surface 31a or a combination of these crystal faces.

As described above, the four side surfaces of the flat plate part 31 are comprised of crystal faces inclined relative to the normal line of the major surfaces 31a. Accordingly, as shown in FIG. 3, in a planar view of one major surface 31a, each side surface sticks out from this one major surface 31a toward the outside. The inclination angle θ1 of the m-face 31m relative to the normal line of the major surface 31a is relatively large, therefore the m-face 31m relatively largely sticks out from the one major surface 31a.

Note that, FIG. 3 shows a crystal blank 15 formed by etching leaving portions on the two sides at the short side on the +X side of the flat plate part 31, then breaking off the portions on the two sides to obtain a single piece. Accordingly, at the broken off positions on the +X side, the crystal faces do not stick out. Further, at the corner portions on the −X side in the flat plate part 31, for example, the parts of the side surface sticking out is rounded.

The pair of major surfaces 31a have for example shapes and sizes the same as each other. However, as shown in FIG. 5A and FIG. 5B, the pair of major surfaces 31a are offset from each other in the Z' axis direction. More specifically, each major surface 31a is offset relative to the other major surface 31a to the side opposite to the side on which it is connected to the m-face 31m. From another viewpoint, each major surface 31a faces the other major surface 31a and the m-face 31m connected to this other major surface 31a. The reason for such offset is for example as follows.

The crystal wafer is for example formed by etching from the two surfaces. At this time, recessed grooves dug from the two surfaces by etching are linked with each other to form a through groove, thus the side surfaces on the two sides of the Z' axis direction are formed. From another viewpoint, the side surfaces are formed by connection of the m-faces 31m appearing by etching of one major surface and crystal faces appearing by etching of the other major surface (crystal faces intersecting with the m-faces 31m in FIG. 5A). The positions of the etching masks on the two surfaces are offset so that the mutual connection of these crystal faces is carried out early and/or suitably. As a result, the offset of the major surfaces 31a described above occurs.

Note that, as shown in FIG. 4, in the X-axis direction, the positions of the pair of major surfaces 31a coincide. This is because, at each side surface in the X-axis direction, the upper and lower crystal faces are symmetrical relative to each other, therefore the etching masks need not be offset as described above. Naturally, the positions of the pair of major surfaces 31a may be offset from each other in the X-axis direction as well aiming at some sort of action.

(First Mesa Part)

Each first mesa part 33 is formed in a tableland shape. Accordingly, the first mesa part 33 for example has an upper surface 33a which spreads out at a higher position than the major surface 31a of the flat plate part 31. The upper surface 33a is for example substantially parallel relative to the major surface 31a.

The planar shape of the first mesa part 33 may be suitably formed. In the example shown, it is substantially rectangular. In this rectangle, the long sides are the sides substantially parallel to the X-axis, and the short sides are the sides substantially parallel to the Z' axis. From another viewpoint, in the first mesa part 33, the vibration direction and the long direction of the flat plate part 31 are the long direction.

As shown in FIG. 6A, FIG. 6B, FIG. 7A, and FIG. 7B, the four side surfaces of the first mesa part 33, for example, in the same way as the four side surfaces of the flat plate part 31, are comprised of crystal faces (in the other views, inclination due to the side surfaces comprised of the crystal faces is omitted). The side surfaces of the first mesa part 33 are comprised of crystal faces the same as the side surfaces of the flat plate part 31 which face the same direction or are comprised of different crystal faces due to the etching conditions (etching time etc.)

For example, as shown in FIG. 7B, in the first mesa part 33 on one major surface 31a, a side surface on the side where the one major surface 31a and the m-face 31m are connected is comprised of an m-face 34m (inclination angle is about 54°). The opposite side surface of the first mesa part 33 on the one major surface 31a shown in FIG. 7A is for example comprised of a crystal face with an angle of about 3°. Note that, on the Y' Z' cross-section, the pair of first mesa parts 33 are mutually rotationally symmetrically shaped Further, for example, the side surface on the −X side of the first mesa part 33 shown in FIG. 6A, in the same way as the side surface on the −X side of the flat plate part 31, is comprised of a crystal face having an inclination angle of about 55°. The side surface on the +X side of the first mesa part 33 is for example comprised of a crystal face with an angle of about 27°, a crystal face with an angle of about 58°, or a combination of these crystal faces. Note that, at the XY' cross-section, the pair of first mesa parts 33 are mutually line symmetrically shaped relative to the symmetrical axis parallel to the X-axis.

The first mesa part 33, as a whole (whole circumference), is positioned on an inner side from the outer edge of the major surface 31a (its overall circumference) of the flat plate part 31. As described above, the side surfaces of the first mesa part 33 are formed by crystal faces inclined relative to the normal line of the major surface 31a. In other words, the first mesa part 33 has a foot of a mountain spreading out from the upper surface 33a toward the outside. The outer edge of this foot is positioned on an inner side from the outer edge of the major surface 31a over its entire circumference. From another viewpoint, the major surface 31a is exposed to the outside of the first mesa part 33 over the entire circumference of the first mesa part 33.

Note that, as will be understood from one example of the dimensions which will be explained later, the thickness of the first mesa part 33 is relatively small in comparison with the sizes of the major surface 31a and upper surface 33a. Consequently, the size of the foot of the first mesa part 33 is smaller in comparison with the size of the upper surface 33a. Accordingly, using the outer edge of the upper surface 33a as the standard, it may be judged that the first mesa part 33 is positioned on an inner side from the outer edge of the major surface 31a. In the explanation in the present disclosure, when referring to the planar shape etc. of the first mesa part 33, unless it is particularly explained otherwise, the shape of the upper surface 33a and the shape of the outer edge of the foot are equivalent (same is true also for the upper surface 35a and foot of a mountain in the second mesa part 35 which will be explained later).

The first mesa part 33, for example, is positioned at substantially the center of the flat plate part 31 in the Z' axis direction (short direction of the flat plate part 31). Further, the first mesa part 33, for example, is positioned somewhat closer to the −X side than the center of the flat plate part 31 (opposite side to the lead electrodes 19) in the X-axis direction (long direction of the flat plate part 31).

(Second Mesa Part)

Each second mesa part 35, in the same way as the first mesa part 33, is tableland shaped. Accordingly, the second mesa part 35 for example has an upper surface 35a which spreads out at a higher position than the upper surface 33a of the first mesa part 33. The upper surface 35a is for example substantially parallel relative to the major surface 31a of the flat plate part 31 and the upper surface 33a of the first mesa part 33.

The planar shape of the second mesa part 35 may be suitably formed. In the example shown, it is substantially rectangular. In this rectangle, the long sides are the sides substantially parallel to the X-axis, and the short sides are the sides substantially parallel to the Z' axis. From another viewpoint, in the second mesa part 35, the vibration direction and the long direction of the flat plate part 31 are the long direction.

As shown in FIG. 6A, FIG. 6B, FIG. 7A, and FIG. 7B, for example, in the same way as the four side surfaces of the flat plate part 31 and first mesa part 33, the four side surfaces of the second mesa part 35 are comprised of crystal faces (in the other views, inclination due to the side surfaces being comprised of the crystal faces is omitted). The side surfaces of the second mesa part 35 are comprised of crystal faces the same as the side surfaces of the first mesa part 33 which face the same direction or comprised of different crystal faces due to the etching conditions (etching time etc.)

For example, as shown in FIG. 7B, in the second mesa part 35 on one major surface 31a, the side surface on the side where the one major surface 31a and the m-face 31m are connected is comprised of the m-face 34m (inclination angle is about 54°). The opposite side surface of the second mesa part 35 on the one major surface 31a shown in FIG. 7A is for example comprised of a crystal face with an angle of about 3°. Note that, on the Y' Z' cross-section, the pair of second mesa parts 35 are rotationally symmetrically shaped relative to each other.

Further, for example, the side surface on the −X side of the second mesa part 35 shown in FIG. 6A, in the same way as the side surfaces on the −X side of the flat plate part 31 and first mesa part 33, is comprised of a crystal face having an inclination angle of about 55°. The side surface on the +X side of the second mesa part 35 is for example comprised of a crystal face with an angle of about 27°. Note that, at the XY' cross-section, the pair of second mesa parts 35 are mutually line symmetrically shaped relative to the symmetrical axis parallel to the X-axis.

The second mesa part 35 is positioned on an inner side from the outer edge of the upper surface 33a of the first mesa part 33 at the two sides of the long direction (X-axis direction). On the other hand, the second mesa part 35 has a width equivalent to the upper surface 33a of the first mesa part 33 in the short direction (Z' axis direction). From another viewpoint, the second mesa part 35 is a rectangle with long sides matching the long sides of the first mesa part 33 and the short sides positioned on the inner sides from the short sides of the first mesa part 33.

More specifically, at the two sides of the X-axis direction, the outer edge of the foot of the second mesa part 35 is positioned on an inner side from the outer edge of the upper surface 33a. From another viewpoint, the first mesa part 33 exposes its upper surface 33a at the two sides of the X-axis direction relative to the second mesa part 35. In the X-axis direction, the second mesa part 35 is for example positioned at the center of the first mesa part 33. Further, at the two sides of the Z' axis direction, the side surface of the second mesa part 35 and the side surface of the first mesa part 33 become flush (continuous). From another viewpoint, at the two sides of the Z' axis direction, the upper surface of the first mesa part 33 (surface parallel to the major surface 31a) is not formed.

Note that, the flush side surfaces of the first mesa part 33 and the second mesa part 35 on each side of the Z' axis direction are comprised of for example single crystal faces. Specifically, for example, as shown in FIG. 7B, the flush side surfaces of the first mesa part 33 and second mesa part 35 may be formed by the m-face 34m. Further, for example, as shown in FIG. 7A, the flush side surfaces of the first mesa part 33 and second mesa part 35 may be formed by a crystal face with an angle relative to the normal line of the major surface 31a of about 3° as well. However, the flush side surfaces may be comprised of a combination of two or more crystal faces as well (need not be one plane).

(Excitation Electrodes)

The pair of excitation electrodes 17 are configured by conductive layers superposed on the surfaces of the crystal blank 15. The conductive layers are for example Au (gold), Ag (silver), or Au—Ag alloy or another metal. The conductive layers may be configured by pluralities of layers made of materials different from each other as well.

The pair of excitation electrodes 17 are positioned on the pair of major surfaces of the crystal blank 15. More specifically, each excitation electrode 17 is mainly superposed on the upper surface 35a of the second mesa part 35. Further, the excitation electrode 17, at the two sides of the X-axis direction, reaches the outer edge of the upper surface 35a of the second mesa part 35 and is positioned on an inner side from the outer edge of the upper surface 33a of the first mesa part 33. More specifically, at the two sides of the X-axis direction, the end part of the excitation electrode 17 is positioned between the outer edge of the foot of the second mesa part 35 and the outer edge of the upper surface 33a of the first mesa part 33 (from another viewpoint, on the upper surface 33a). Further, the excitation electrode 17 is positioned on an inner side from the outer edge of the upper surface 35a of the second mesa part 35 at the two sides of the Z' axis direction.

The planar shape of each excitation electrode 17 is formed similar to the planar shapes of the first mesa part 33 and second mesa part 35. In the example shown, the planar shape of the excitation electrode 17 is a rectangle having long sides parallel to the X-axis direction and shorts sides parallel to the Z' axis direction. Further, for the short sides as a whole, the positional relationships at the two sides of the X-axis direction described above stand. Further, for the long sides as a whole, the positional relationships at the two sides of the Z' axis direction described above stand.

(Lead Electrodes)

The pair of lead electrodes 19, for example, as shown in FIG. 3, have at least one pair of pads 37 to be bonded to a pair of bumps 21 and a pair of interconnects 39 connecting the pair of pads 37 and the pair of excitation electrodes 17. These are for example configured by the same conductive layers as those for the excitation electrodes 17. However, parts (for example pads 37) or all of the lead electrodes 19 may be configured by a material different from that for the excitation electrodes 17 as well.

The pair of pads 37 are provided on at least one of the pair of major surfaces of the vibration element 5. Note that, in the example shown, the vibration element 5 is formed rotationally symmetrical by 180° around the X-axis so that any of the pair of major surfaces may be made to face the bottom surface of the recessed part 3a. The pair of lead electrodes 19 have a pair of pads 37 on each of the pair of major surfaces (two pairs of pads 37 in total).

The pair of pads 37 are for example aligned along one of the two short sides of the flat plate part 31. This short side on the side where the pair of pads 37 are arranged is for example the short side on the +X side between the pair of short sides. Naturally it may be the short side on the −X side as well. The shape of the pads 37 may be a suitable one. For example, it is substantially a rectangle having sides parallel to the X-axis and Z' axis. The pads 37 are for example made larger in the length in the Z' axis direction than the length in the X-axis direction.

Each interconnect 39, for example, in a planar view of the excitation electrode 17 with which that interconnect 39 is connected, extends out from the corner portion on the pad 37 side and on the m-face 31m side. Note that, when referring to "extends out from the corner portion", it includes a case where one lateral side edge part of the interconnect 39 is positioned at an intersecting point of the long side and the short side of the excitation electrode 17 (case where the interconnect 39 extends out from the end part of the long side or short side) as well. Further, the interconnect 39 may extend out only from the portion on the first mesa part 33 in the excitation electrode 17 or may extend out from the portion on the first mesa part 33 and the portion on the second mesa part 35 in the excitation electrode 17.

Further, the interconnect 39 for example extends from the excitation electrode 17 toward the m-face 31m connected with the major surface 31a on which this excitation electrode 17 is superposed. Specifically, on the +Y' side shown in FIG. 3, the interconnect 39 extends toward the −Z' side. On the −Y' side on the back side thereof, the interconnect 39 extends toward the +Z' side. Further, in the example shown, the interconnect 39 linearly extends in a direction inclined relative to the Z' axis so that a portion closer to the m-face 31m side is positioned closer to the pad 37 side.

When reaching the m-face 31m, the interconnect 39 extends in the X-axis direction (to the pad 37 side) in a state where at least a portion is superposed on the m-face 31m. In the example shown, the interconnect 39 extends over the m-face 31m with the same width as the m-face 31m. However, the interconnect 39 may include a portion extending on the major surface 31a in the X-axis direction or may extend in the X-axis direction in a state where a portion of the m-face 31m on the opposite side to the major surface 31a is exposed.

Further, the interconnect 39, in the end part on the pad 37 side of the crystal blank 15, is connected through a ridge formed by the major surface 31a and m-face 31m with the pad 37. Note that, the width of each portion of the interconnect 39 may be suitably set. Further, the pair of pads 37 positioned on one major surface 31a and the pair of pads 37 positioned on the other major surface 31a are for example connected by portions in the lead electrodes 19 which are positioned on the side surface on the +X side of the crystal blank 15.

(Example of Dimensions)

An example of the various dimensions of the vibration element 5 will be explained next. Note that, notations (L0, L1, L2, Le, W0, W1, W2, We, s1, s2) representing various dimensions when viewed on a plane are shown in FIG. 3. Further, notations (t, Md, h1, h2) representing various thicknesses are shown in FIG. 4 and FIG. 6B. Note that, the dimensions when viewed on a plane are distances on a plane formed by projecting the vibration element 5 in a direction viewed on a plane, but are not distances along relief shapes of the vibration element 5.

The thickness "t" of the total of the flat plate part 31, pair of first mesa parts 33, and pair of second mesa parts 35 (thickness of the vibration part) is set based on a desired natural frequency for thickness shear vibration. For example, where use is made of fundamental wave oscillation, when defining the natural frequency as "F", the basic formula for finding the thickness "t" corresponding to this natural frequency F is t(μm)=1670/F (MHz). Note that, in actuality, the thickness "t" is set to a value finely adjusted from the value in the basic formula considering the weight of the excitation electrodes 17 etc. as well.

The thickness of the flat plate part 31 (from another viewpoint, a dug amount Md for forming the first mesa parts 33 and second mesa parts 35) may be for example suitably set from the viewpoints of the energy trapping effect and the like. For example, the dug amount Md (=h1+h2) at each major surface of the crystal blank 15 is 5% to 15% or 9% to 11% of the thickness "t" of the vibration part.

Either of the height h1 from the major surface 31a of the flat plate part 31 to the upper surface 33a of the first mesa part 33 or the height h2 from the upper surface 33a of the first mesa part 33 to the upper surface 35a of the second mesa part 35 may be larger than the other. Also the ratio thereof may be suitably set. In the present embodiment, the height h1 and the height h2 are made equivalent to each other.

As the length L0 and the width W0 of the crystal blank 15 (flat plate part 31), in the present embodiment, relatively small ones are supposed. Here, the length L0 and the width W0, as understood also from FIG. 3, are a length and width where the protrusion of the side surfaces of the crystal blank 15 is considered. That is, the length L0 and the width W0 are the maximum length and the maximum width when viewed on a plane. The length L0 is for example less than 1000 μm or less than 910 μm. The aspect ratio (L0/W0) may be suitably set. For example, it may be set to 1.2 to 1.5 or 1.3 to 1.4.

When viewed on a plane, the first mesa part 33 may be set relatively larger relative to the crystal blank 15 (flat plate part 31). For example, a difference between the length L0 of the flat plate part 31 and the length L1 of the upper surface 33a (may be the foot as well) of the first mesa part 33 (L0-L1) is less than 0.3 time of the length L0. A difference between the width W0 of the flat plate part 31 and the width W1 of the upper surface 33a (may be the foot as well) of the first mesa part 33 (W0-W1) is for example less than 0.3 time or less than 0.2 time of the width W0. Further, the aspect ratio (L1/W1) may be suitably set. For example, it may be set to 1.1 to 1.5 or 1.2 to 1.4.

On one side of the X-axis direction, a distance s1 between the outer edge of the upper surface 33a of the first mesa part 33 and the outer edge of the upper surface 35a of the second mesa part 35 may be suitably set. For example, the distance s1 is 3% to 10% or 3.1% to 9.4% of the length L1 of the upper surface 33a of the first mesa part 33.

The length Le of the excitation electrode 17 may be suitably set so far as the end parts in the X-axis direction are positioned on the upper surface 33a of the first mesa part 33. For example, the length Le may be set so that the distance between the outer edge of the excitation electrode 17 and the outer edge of the upper surface 33a at each of the two sides of the X-axis direction becomes 5 μm to 15 μm (for example 10 μm). In this case, the length Le of the excitation electrode 17 is made relatively large.

Further, the width We of the excitation electrode 17 may be suitably set so far as the end parts in the Z' axis direction are positioned on the inner side of the outer edge of the upper surface 35a of the second mesa part 35. For example, the width We may be set so that the distance between the outer edge of the excitation electrode 17 and the outer edge of the upper surface 35a at each of the two sides of the Z' axis direction becomes 5 μm to 15 μm (for example 10 μm). In this case, the width We of the excitation electrode 17 is made relatively large.

As explained above, the flat plate part 31 may be formed relatively narrow, and the first mesa part 33 may be formed relatively broad relative to the flat plate part 31. Accordingly, the major surfaces 31a of the flat plate part 31 are secured relatively narrow on the periphery of the first mesa parts 33. Relative to this size, the distance s2 between the excitation electrode 17 and the pad 37 may be set relatively larger. For example, as an absolute value, the distance s2 of over 40 μm may be secured. Further, the distance s2 may be set to 0.9 time to 1.1 times the distance between the outer edge of the major surface 31a and the excitation electrode 17 on the opposite side to the pads 37 (−X side).

Note that, since the distance s2 is secured as described above, the pads 37 may be made relatively shorter in length in the X-axis direction. For example, the length in the X-axis direction of the pads 37 is shorter than the distance s2. Further, for example, the length in the X-axis direction of the pads 37 is ⅓ or less of the length in the Z' axis direction of the pads 37. However, the distance s2 need not be 40 μm or more either. For example, when the length L1 is 640 μm to 660 μm, the distance s2 may be set to 20 μm to 60 μm as well.

Further the specific values of various dimensions explained heretofore may be suitably set. One example thereof will be explained below. The length L0 is 600 μm to 1000 μm or 835 μm to 850 μm. The width W0 is 500 μm to 700 μm or 620 μm to 640 μm (however, W0<L0). The length L1 is 450 μm to 750 μm or 635 μm to 660 μm (however, L1<L0). The width W1 is 400 μm to 650 μm or 460 μm to 540 μm (however, W1<L1, w1<w0). The length L2 is 400 μm to 700 μm or 580 μm to 610 μm (however, L2<L1). The length Le is 430 μm to 730 μm or 615 μm to 640 μm (however, L1<Le<L2). The width We is 380 μm to 630 μm or 440 μm to 520 μm (however, We<W1).

The thickness "t", for example, when assuming 4 MHz to 80 MHz as the frequency F, is substantially 20 μm to 420 μm in terms of the fundamental value (1670/F). Otherwise, when assuming 20 MHz to 40 MHz as the frequency F, it is substantially 40 μm to 80 μm in terms of the fundamental value. Further, when assuming that the dug amount Md at this time is 10% of the thickness "t", it is 2 μm to 42 μm or 4 μm to 8 μm. The thickness of the conductive layers (excitation electrodes 17 and lead electrodes 19) is 0.05 μm to 0.3 μm.

(Method for Manufacturing Vibrator)

The unit 1 is prepared by preparing the element mounting member 3, vibration element 5, and lid 7 in parallel, mounting the vibration element 5 in the element mounting member 3, then air-tightly sealing the recessed part 3a by the lid 7. The manufacturing method of the element mounting member 3, the manufacturing method of the lid 7, the method for mounting the vibration element 5 in the element mounting member 3, and the method for bonding the lid 7 to the element mounting member 3 at this time may be made the same as the known methods.

Also, other than tailoring the shape of the etching mask and the etching conditions etc. to the specific shape of the vibration element 5, the method for manufacturing the vibration element 5 may be made the same as the known method. In the following description, an outline of one example of that will be explained.

Figure 8:
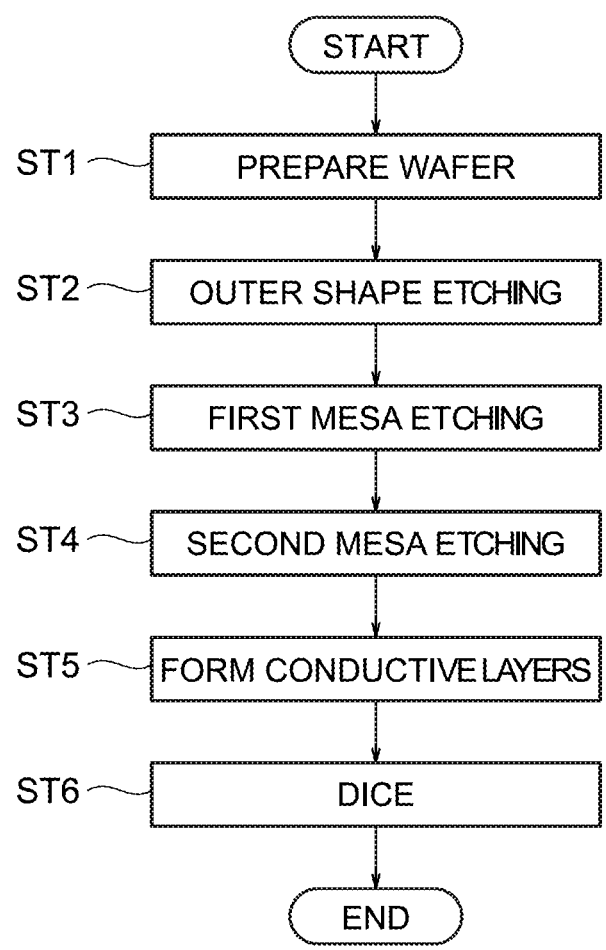
FIG. 8 is a flow chart showing an outline of one example of the procedure of a method for manufacturing the crystal vibration element in FIG. 3.

FIG. 8 is a flow chart showing an outline of one example of the procedure of the method for manufacturing the vibration element 5.

At step ST1, a wafer made of quartz crystal is prepared. Note that, the "wafer" referred to here may be a plate shaped one from which many crystal blanks 15 are taken. It need not be a disk shaped one. Specifically, for example, an artificial crystal is lumbered or sliced to cut out a wafer at an angle explained with reference to FIG. 1. Further, that cut wafer is lapped, etched, and/or polished to form a wafer having a pair of major surfaces parallel to each other.

At step ST2, the wafer is etched in outer shape for forming the schematic shapes of the crystal blanks 15. Specifically, first, masks are formed on the two surfaces of the wafer. Each mask has a plurality of portions each having substantially the same planar shape as the planar shape (excluding the protrusion of the side surfaces) of the crystal blank 15 (flat plate part 31) shown in FIG. 3. Further, the mask is shaped so that the plurality of portions described above are connected to each other through the two sides of the short sides on the +X sides. Next, the wafer is wet etched through the above masks from the two sides. This etching is carried out for an etching time long enough to form through-grooves in the wafer. Due to this, through-grooves are formed on the peripheries of regions which will become the crystal blanks 15 (flat plate parts 31) and the side surfaces of the crystal blanks 15 are formed. Further, the plurality of crystal blanks are connected through the two sides of the short sides on the +X sides with each other, so the wafer state is maintained. After that, the masks are removed.

At step ST3, first mesa etching for forming mesa shapes is carried out. Specifically, first, masks are formed on the two surfaces of the wafer. Each mask has a plurality of portions each having substantially the same planar shape as the planar shape of the first mesa part 33. Next, the wafer is wet etched through those masks from the two sides. This etching is carried out for an etching time substantially long enough to dig into the two surfaces of the wafer to a depth corresponding to the height h1. Due to this, regions outside of the regions which will become the first mesa parts 33 are made thinner by a thickness corresponding to the height h1. After that, the masks are removed.

At step ST4, second mesa etching for completing the crystal blanks 15 before dicing is carried out. Specifically, first, masks are formed on the two surfaces of the wafer. Each mask has a plurality of portions each having substantially the same planar shape as the planar shape of the second mesa part 35. Next, the wafer is wet etched through those masks from the two sides. This etching is carried out for an etching time substantially long enough to dig into the two surfaces of the wafer to a depth corresponding to the height h2. Due to this, regions outside of the regions which will become the second mesa parts 35 are made thinner by a thickness corresponding to the height h2. After that, the masks are removed.

By steps ST2 to ST4, flat plate parts 31, first mesa parts 33, and second mesa parts 35 are formed. Specifically, the side surfaces of the flat plate parts 31 are formed by the etching operations at steps ST2 to ST4. The major surfaces 31a of the flat plate parts 31 and the side surfaces of the first mesa parts 33 are formed by the etching operations at steps ST3 and ST4. The upper surfaces 33a of the first mesa parts 33 and the side surfaces of the second mesa parts 35 are formed by the etching operations at step ST4. Note that, the upper surfaces of the second mesa parts 35 are not etched, but are formed at step ST1.

At step S5, the pairs of excitation electrodes 17 and pairs of lead electrodes 19 are formed on the crystal blanks 15. Specifically, for example, conductive layers for them are formed by deposition of conductive materials through masks or formed by etching through masks after deposition of conductive materials. Note that, when depositing materials by sputtering, the wafer may be rotated in a suitable direction during the deposition as well. Due to this, the film forming property for the side surfaces of the portions of the crystal blanks 15 can be improved.

At step ST6, the plurality of crystal blanks 15 in the wafer state are separated. For example, each crystal blank 15 is pressed down or lifted up to break off the crystal blank 15 from frame-shaped portions connecting the plurality of crystal blanks 15 to each other. Due to this, a plurality of vibration elements 5 divided into pieces are prepared.

As described above, the vibration element 5 in the present embodiment has the crystal blank 15 and pair of excitation electrodes 17. The crystal blank 15 is plate shaped cut for thickness shear vibration (AT-cut) and has the vibration direction (X-axis direction) as the long direction. The pair of excitation electrodes 17 are positioned on the two sides of the crystal blank 15. The crystal blank 15 has the flat plate part 31 having the pair of major surfaces 31a, the pair of tableland-shaped first mesa parts 33 projecting from the pair of major surfaces 31a, and the pair of tableland-shaped second mesa parts 35 projecting from the upper surfaces 33a of the pair of first mesa parts 33. In the flat plate part 31, the length in the long direction is longer than the length in the short direction (Z' axis direction) perpendicular to the long direction, and the length in the long direction is less than 1000 μm. The first mesa parts 33 are longer in the length in the long direction of the flat plate part 31 than the length in the short direction of the flat plate part 31 and are positioned on an inner side from the outer edge of the major surface 31a of the flat plate part 31 over the entire circumference of the outer edge. The second mesa parts 35 are longer in the length in the long direction of the flat plate part 31 than the length in the short direction of the flat plate part 31, are positioned on inner sides from the outer edges of the upper surfaces 33a of the first mesa parts 33 at the two sides of the long direction of the flat plate part 31, and have widths equivalent to the upper surfaces 33a of the first mesa parts 33 in the short direction of the flat plate part 31. The excitation electrodes 17, at the two sides of the long direction of the flat plate part 31, reach the outer edges of the upper surfaces 35a of the second mesa parts 35, are positioned on inner sides from the outer edges of the upper surfaces 33a of the first mesa parts 33, and are positioned on inner sides from the outer edges of the upper surfaces 35a of the second mesa parts 35 at the two sides of the short direction of the flat plate part 31.

In this way, in the vibration element 5, between the long direction (X-axis direction) of the vibration direction of the thickness shear vibration and the short direction (Z' axis direction) which is not the vibration direction, the mesa shapes and the positional relationships between the mesa shapes and the excitation electrodes 17 differ from each other. That is, at the XY' cross-section including the vibration direction, the mesa shape becomes a two-step mesa, and the excitation electrode 17 covers over the entirety of the second mesa part 35. On the other hand, at the Y' Z' cross-section not including the vibration direction, the mesa shape becomes a one-step mesa, and the excitation electrode 17 is positioned on the inner side from the second mesa part 35. According to such a configuration, in a small-sized vibration element less than 1000 µm, the vibration characteristic can be improved. This was found and confirmed by simulation computations by the inventors of the present application. As the reason for improvement of the vibration characteristic, for example the following reason may be considered.

The contour lines of distribution of the vibration energy form elliptical shapes at various cross-sections. Further, at the XY' cross-section including the vibration direction, the shape of the crystal blank 15 becomes closer to an ellipse due the two-step mesa, therefore the energy trapping effect is improved. In particular, when the excitation electrode 17 covers the entirety of the upper surface 35a of the second mesa part 35 and is positioned on an inner side from the outer edge of the upper surface 33a of the first mesa part 33, the shape of the distribution of the vibration energy and the shape of the crystal blank 15 are easy to be made closer.

On the other hand, at the Y'Z' cross-section not including the vibration direction of the thickness shear vibration, the ratio of unwanted vibration becomes larger. Therefore, when forming a two-step mesa, there is a possibility of greater influence of spurious emission. It is confirmed also in simulations by the inventors that the number of spurious emissions is decreased more in the one-step mesa than the two-step mesa for the Y'Z' cross-section. Further, in the Z' axis direction, if the excitation electrode 17 is positioned on an inner side from the outer edge of the upper surface 35a of the second mesa part 35, the spurious emission is easily suppressed. This is because, in each second mesa part 35, the side surfaces on the two sides of the Z' axis direction are comprised of mutually different crystal faces and in turn exert mutually different influences upon the vibration characteristic, but those influences are reduced.

Further, in the present embodiment, each excitation electrode 17 spreads up to the upper surface 33a of the first mesa part 33 in the long direction of the flat plate part 31.

In this case, in comparison with the case where the excitation electrode 17 spreads covering only the entirety of the upper surface 35a of the second mesa part 35 in the long direction of the flat plate part 31, improvement of the vibration characteristic is confirmed according to simulation computations by the inventors. The reason for this is for example as follows: If the end parts of the excitation electrode 17 are positioned on the upper surface 33a of the first mesa part 33, steps due to the end parts of the excitation electrode 17 are positioned between the steps due to the first mesa part 33 and the steps due to the second mesa part 35, therefore a quasi three-step mesa is configured. That is, the shape of the vibration element 5 may easily become closer to the shape of the distribution of the vibration energy.

Further, in the present embodiment, the vibration element 5 further has the pair of lead electrodes 19 which are individually connected to the pair of excitation electrodes 17. Each of the pair of lead electrodes 19 includes a pad 37 positioned at the end part on one side (+X side) of the long direction in at least one major surface 31a of the flat plate part 31. When viewed on a plane, the distance s1 between the outer edge on the one side (+X side) of the upper surface 33a of the first mesa part 33 and the outer edge on the one side (+X side) of the upper surface 35a of the second mesa part 35 is 3% to 10% of the length L1 in the long direction of the upper surface 33a of the first mesa part 33. Further, when viewed on a plane, the distance s2 between the edge part on the one side (+X side) of the excitation electrode 17 and the pad 37 is 40 µm or more.

Accordingly, for example, by the distance s1 having a length not less than 3% of the length L1 being secured, the influence of a reflection wave at the side surface of the first mesa part 33 exerted upon the vibration of the second mesa part 35 can be reduced. Further, for example, by the distance s1 being controlled to 10% or less of the length L1, it becomes easier to obtain the energy trapping effect by the two-step mesa. Further, by a distance s2 of 40 µm or more being secured, an influence of fastening at the pads 37 upon the vibration between the pair of excitation electrodes 17 is reduced.

Further, in the present embodiment, the flat plate part 31 has the m-face 31m connected to the one (for example+Y' side) major surface 31a at the one (for example −Z' side) side surface of the short direction of the flat plate part 31. One of the pair of lead electrodes 19 has the interconnect 39 and pad 37. The interconnect 39 extends from the excitation electrode 17 positioned on the one major surface 31a side to the m-face 31m at the one side surface and extends on the m-face 31m to one side (+X side) of the long direction of the flat plate part 31 next. The pad 37 is positioned in the end part on the one side (+X side) of the flat plate part 31 and is connected to the interconnect 39.

Accordingly, when viewed on a plane, part or all (present embodiment) of the interconnect 39 can be prevented from being positioned between the excitation electrode 17 and the pad 37. As a result, for example, even if the length L0 of the crystal blank 15 is short, the influence of the potential of the lead electrode 19 exerted upon the region under the excitation electrode 17 of the crystal blank 15 can be reduced. Consequently, the vibration characteristic is improved.

Further, in the present embodiment, the difference between the length L0 in the long direction of the flat plate part 31 and the length L1 in the long direction of the upper surface 33a of the first mesa part 33 is less than 0.3 time the length L0.

Accordingly, for example, in a small-sized crystal blank 15 having a length L0 not more than 1000 µm, the length L1 of the first mesa part 33 is secured relatively large. According to the configuration forming the two-step mesa in the long direction as explained above or the like, even if the first mesa part 33 is formed relatively large in this way, reduction of the energy trapping effect is suppressed. Further, even if the first mesa part 33 is formed relatively large in this way according to the configuration arranging the interconnect 39 on the m-face 31m as explained above, the influence of the lead electrode 19 exerted upon the vibration characteristic is reduced.

(Modifications)

Below, various modifications will be illustrated.

Figure 9A:
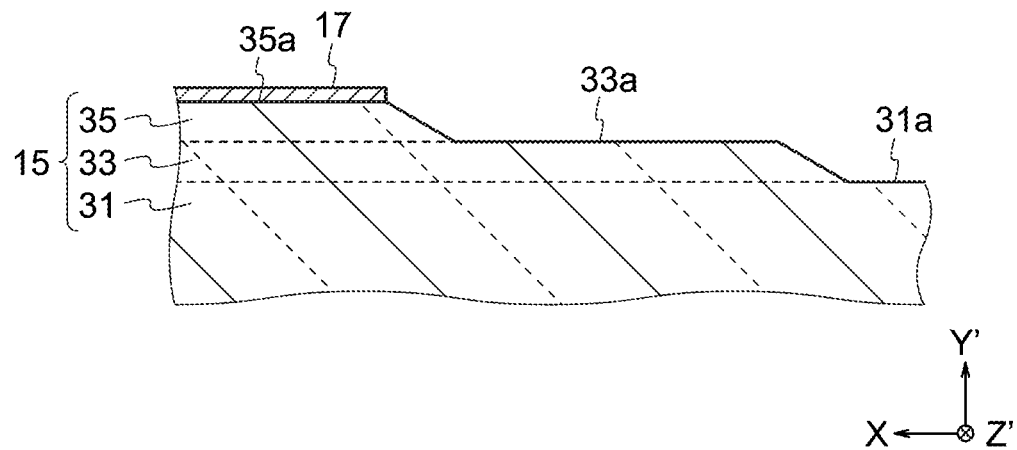
FIG. 9A, FIG. 9B, and FIG. 9C are views showing the configurations of crystal vibration elements according to modifications.

FIG. 9A is a cross-sectional view corresponding to FIG. 6A showing a vibration element in a modification. In this modification, each excitation electrode 17 reaches the outer edge of the upper surface 35a of the second mesa part 35 in the long direction of the crystal blank 15, but does not spread over the upper surface 33a of the first mesa part 33. Specifically, the end part of the excitation electrode 17 is positioned on the outer edge of the upper surface 35a. Even in such a configuration, the same effects as the above embodiment are exhibited. Note that, although not particularly shown, the end part of the excitation electrode 17 may be positioned on the foot of the second mesa part 35 as well. Further, even if it is said that the end part of the excitation electrode 17 is positioned on the outer edge of the upper surface 35a, naturally the end part may be positioned on the inner side or outer side from the outer edge of the upper surface 35a within a range of manufacturing error.

Figure 9B:
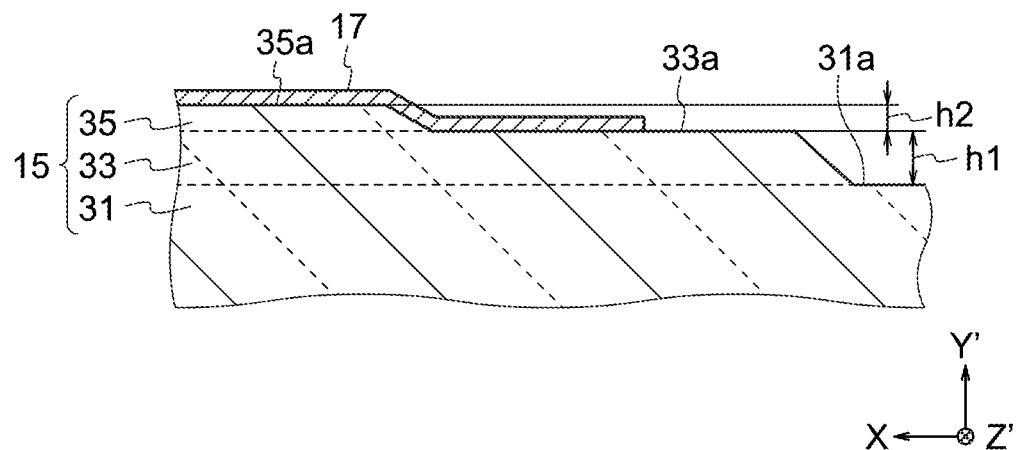

FIG. 9B is a cross-sectional view corresponding to FIG. 6A showing a vibration element in another modification. In this modification, the height h1 of the first mesa part 33 is set larger than the height h2 of the second mesa part 35. Note that, h1+h2 (=Md) may be for example set in the same way as the above embodiment. The ratio of h1 and h2 may be suitably set. For example, the height h1 is 2 times to 9 times or 2.33 times to 9 times the height h2. If the height h1 is larger relative to the height h2 in this way, it becomes easier to make the shapes formed by the first mesa part 33 and second mesa part 35 closer to an ellipse.

Figure 9C:
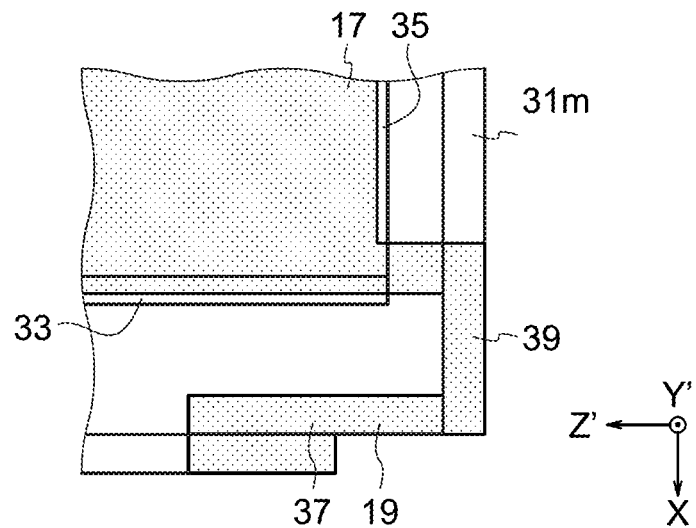

FIG. 9C is a plan view corresponding to the portion on the bottom right of the drawing sheet in FIG. 3 showing a vibration element in still another modification. As shown in this view, in the interconnect 39, the portion extending from the excitation electrode 17 toward the m-face 31m need not be inclined to the short direction (Z' axis direction) of the crystal blank 15, but may be parallel relative to the short direction.

The technique according to the present disclosure is not limited to the above embodiment and modifications and may be executed in various ways.

The crystal device having a crystal vibration element is not limited to a crystal unit. For example, the device having the crystal vibration element may be an oscillator having an integrated circuit (IC) element generating oscillation signals by supplying a voltage to the crystal vibration element as well. Further, for example, the crystal device (crystal unit), other than the crystal vibration element, may be one having a thermistor or another electronic element as well. Further, the crystal device may be one equipped with a crystal oven as well. In the crystal device, the structure of the package packaging the crystal vibration element may be suitable one. For example, the package may be one having an H-shaped cross-section having a recessed part in its upper surface and lower surface as well.

The thickness shear vibration-use cut is not limited to the AT-cut. For example, it may be BT-cut as well. Further, the crystal blank is not limited to one configured by only quartz crystal and includes one made of a material obtained by injecting a dopant made of metal or the like into the crystal.

The shapes of the flat plate part, first mesa parts, and second mesa parts when viewed on a plane are not limited to rectangles. For example, in at least one among them, the pair of long edges (long sides) and/or pair of short edges (short sides) may be arc-shaped so as to extend outward as well. Further, in the flat plate part, first mesa parts, or second mesa parts, each long edge may be inclined relative to the long direction or may be either line symmetrical or asymmetrical relative to the symmetrical axis perpendicular to the long direction. Further, the pair of long edges may be either line symmetrical or asymmetrical relative to the symmetrical axis parallel to the long direction. The same is true for each short edge and pair of short edges.

The crystal vibration element is not limited to one supported in a cantilever manner by provision of a pair of pads (lead electrodes) on one major surface. For example, the pair of lead electrodes may extend from the pair of excitation electrodes in directions reverse to each other and the two ends of the crystal vibration element may be supported.

The flat plate part may be formed so that the outer edges (long edges, long sides) positioned in the short direction of the pair of major surfaces coincide with each other (so that the pair of major surfaces are not offset in the short direction).

Priority is claimed on Japanese application No. 2018-034426, filed on Feb. 28, 2018, the contents of which is incorporated herein by reference.

REFERENCE SIGNS LIST

1 . . . crystal unit (crystal device), 5 . . . crystal vibration element, 15 . . . crystal blank, 17 . . . excitation electrode, 31 . . . flat plate part, 31a . . . major surface (of flat plate part), 33 . . . first mesa part, 33a . . . upper surface (of first mesa part), 35 . . . second mesa part, and 35a . . . upper surface (of second mesa part).

The invention claimed is:

1. A crystal vibration element comprising
  a crystal blank of a thickness shear vibration-use cut plate shape in which a long direction is a vibration direction and
  a pair of excitation electrodes on the two surfaces of the crystal blank, wherein
  the crystal blank comprises
    a flat plate part comprising a pair of major surfaces,
    a pair of tableland-shaped first mesa parts projecting from the pair of major surfaces and
    a pair of tableland-shaped second mesa parts projecting from upper surfaces of the pair of first mesa parts,
  in the flat plate part, a length in the long direction is longer than a length in a short direction perpendicular to the long direction in a plan view, and the length in the long direction is less than 1000 μm,
  the first mesa part is longer in length in the long direction than length in the short direction and is located on an inner side from an outer edge of the major surface of the flat plate part over the entire circumference of the outer edge,
  the second mesa part is longer in length in the long direction than length in the short direction, is located on an inner side from an outer edge of the upper surface of the first mesa part at two sides of the long direction, and has a width equivalent to a width of the upper surface of the first mesa part in the short direction, and
  the excitation electrode reaches an outer edge of an upper surface of the second mesa part at the two sides of the long direction, an outer edge of the excitation electrode is located on an inner side from the outer edge of the upper surface of the first mesa part at the two sides of the long direction, and the outer edge of the excitation electrode is located on an inner side from the outer edge of the upper surface of the second mesa part at two sides of the short direction.

2. The crystal vibration element according to claim 1, wherein the excitation electrode spread over the upper surface of the first mesa part in the long direction.

3. The crystal vibration element according to claim 1, further comprising a pair of lead electrodes individually connected to the pair of excitation electrodes, wherein each of the pair of lead electrodes comprises a pad in an end part on one side of the long direction in at least one major surface of the flat plate part, when viewed on a plane, a distance between the outer edge on the one side of the upper surface of the first mesa part and the outer edge on the one side of the upper surface of the second mesa part is 3% to 10% of a length in the long direction of the upper surface of the first mesa part and, when viewed on a plane, a distance between an edge part on the one side of the excitation electrode and the pad is 40 μm or more.

4. The crystal vibration element according to claim 1, further comprising a pair of lead electrodes individually connected to the pair of excitation electrodes, wherein the flat plate part comprises an m-face connected to one major surface at one side surface in the short direction, one of the pair of lead electrodes comprises an interconnect which extends from the excitation electrode on the one major surface side toward the m-face on the one side surface and extends on the m-face toward one side of the long direction next, and a pad located in an end part on the one side of the flat plate part and connected to the interconnect.

5. The crystal vibration element according to claim 1, wherein a height from the major surface of the flat plate part to the upper surface of the first mesa part is 2 times to 9 times a height from the upper surface of the first mesa part to the upper surface of the second mesa part.

6. The crystal vibration element according to claim 1, wherein a difference between the length in the long direction of the flat plate part and a length in the long direction of the upper surface of the first mesa part is less than 0.3 time the length in the long direction of the flat plate part.

7. A crystal device comprising
a crystal vibration element according to claim 1 and
a package in which the crystal vibration element is mounted.

* * * * *